(12) United States Patent
Mani et al.

(10) Patent No.: US 7,787,289 B2
(45) Date of Patent: Aug. 31, 2010

(54) MRAM DESIGN WITH LOCAL WRITE CONDUCTORS OF REDUCED CROSS-SECTIONAL AREA

(75) Inventors: Krishnakumar Mani, San Jose, CA (US); Jannier Maximo Roiz Wilson, Santa Clara, CA (US); Anil Gupta, Saratoga, CA (US); Kimihiro Satoh, Santa Clara, CA (US)

(73) Assignee: Magsil Corporation, Santa Clara, CA (US)

( * ) Notice: Subject to any disclaimer, the term of this patent is extended or adjusted under 35 U.S.C. 154(b) by 0 days.

(21) Appl. No.: 11/949,693

(22) Filed: Dec. 3, 2007

(65) Prior Publication Data

US 2009/0141542 A1    Jun. 4, 2009

(51) Int. Cl.
  *G11C 11/00*    (2006.01)
(52) U.S. Cl. .................. 365/158; 365/66; 365/148; 365/171; 365/225.5; 365/243.5; 977/935

(58) Field of Classification Search .................. 365/148, 365/158, 171, 173, 48, 66, 78, 80–93, 100, 365/130, 131, 225.5, 243.5; 257/421, E21.665; 438/3; 977/933–935; 216/22
See application file for complete search history.

(56) References Cited

U.S. PATENT DOCUMENTS

| 6,597,049 | B1 * | 7/2003 | Bhattacharyya et al. ..... 257/421 |
| 6,611,454 | B2 * | 8/2003 | Hidaka ...................... 365/171 |
| 2002/0163063 | A1 * | 11/2002 | Noguchi et al. ............ 257/666 |
| 2005/0024934 | A1 * | 2/2005 | Chen ......................... 365/171 |

* cited by examiner

*Primary Examiner*—Richard Elms
*Assistant Examiner*—Harry W Byrne
(74) *Attorney, Agent, or Firm*—Hahn & Moodley LLP; Vani Moodley, Esq.

(57) ABSTRACT

Embodiments of the present invention disclose an MRAM device having a plurality of magnetic memory cells grouped into words, and write conductors for carrying write currents to write to the memory cells, wherein at least some of the write conductors have a reduced cross-sectional area in the vicinity of a group of memory cells.

15 Claims, 2 Drawing Sheets

MRAM DESIGN WITH LOCAL WRITE CONDUCTORS OF REDUCED CROSS-SECTIONAL AREA

FIELD

Embodiments of the invention relate to magnetoresistive random access memory (MRAM) devices.

BACKGROUND

Magnetoresistance is the property of a material to change its electrical resistance under the influence of an external magnetic field. The Giant magnetoresistance (GMR) is a type of magnetoresistance that manifests as a significant decrease in electrical resistance in the presence of an applied magnetic field. GMR occurs in thin film structures composed of alternating ferromagnetic and non-magnetic metal layers. The tunnel magnetoresistance effect (TMR) occurs when two ferromagnets are separated by a thin (about 1 nm) insulator, in which case the resistance to a tunneling current changes with the relative orientation of the two magnetic layers. The resistance is normally higher in the anti-parallel case.

In a MRAM cell, a magnetic (hereinafter also "magnetoresistive") element defined by a thin film structure comprising ferromagnetic materials selected to have magnetoresistance (either GMR or TMR) is used to store data. MRAM devices may have millions of MRAM cells arranged in an array or grid with read and write conductors to enable reading from and writing to the cells.

Each MRAM cell has two stable and distinct configurations that can be selected by rotating a magnetization of the ferromagnetic material used to store data. Each configuration represents a memory state corresponding to a "1" or a "0".

To write data i.e. a "1" or "0" to a magnetic memory cell, current is passed through read and write conductors in the form of two mutually perpendicular wires which intersect at the memory cell being addressed. MRAM cells respond to the cumulative magnetic field generated by the two mutually perpendicular wires. The magnetic field contributed by each wire is a function of the current density through it.

To realize MRAM devices with greater storage capacity it is desirable to shrink the size of MRAM cells. A consequence of smaller MRAM cells is that the magnetic field required to change the orientation of the ferromagnetic layer on which data is stored is higher. The higher magnetic field required to change the orientation of the ferromagnetic layer may be achieved by reducing the dimensions of the read and write conductors since as noted above the magnetic field generated by these conductors is a function of the current density through the conductors. However, reducing the dimensions of the read and write conductors leads to problems of reliability due to electromigration. Moreover, increases in resistance of the read and write conductors due to their reduced dimensions leads to an increase in the voltage drop. Thus, achievable current densities in the read and write conductors are limited in practice. For the above reasons, efforts to build very high density MRAM devices are being hampered. This is known as the "scaling limitation" hereinafter.

SUMMARY

In one aspect the invention discloses a magnetic memory device, comprising a plurality of magnetic memory cells arranged to form rows; and first write conductors to energize the cells during write operations, the write conductors having at least some portion of increased cross-sectional area and a portion of reduced cross-sectional area.

Other aspects of the invention will be apparent from the detailed description below.

DETAILED DESCRIPTION

Figure 1:
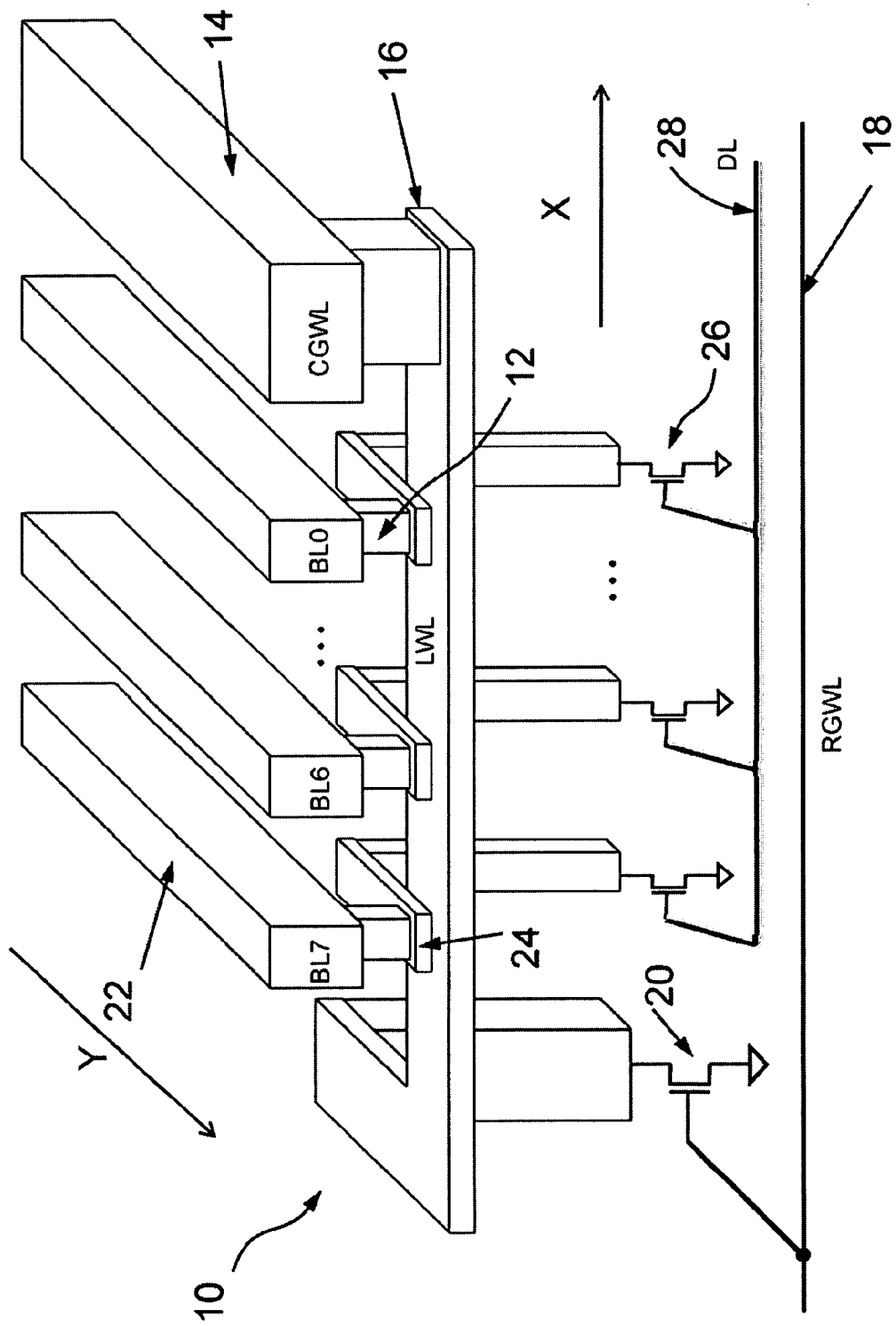
FIG. 1 shows a schematic drawing of a magnetic memory device in accordance with one embodiment of the invention.

In the following description, for purposes of explanation, numerous specific details are set forth in order to provide a thorough understanding of the invention. It will be apparent, however, to one skilled in the art that the invention can be practiced without these specific details. In other instances, structures and devices are shown only in block diagram form in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although the following description contains many specifics for the purposes of illustration, one skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Embodiments of the present invention disclose a magnetic memory device that does not suffer from the current density limitation described above. Hence, advantageously, the scaling limitation is overcome.

In one embodiment, a magnetic memory device is disclosed. The memory device includes a plurality of magnetic memory cells arranged to form rows and columns defining an array. The memory device includes write conductors and read conductors. As used herein "write conductors" are those which enable write operations and the "read conductors" are those which enable read operations. The write conductors comprise X-write conductors disposed in an X direction and Y-write conductors disposed in a Y direction. The X-write conductors have at least some portion of increased cross-sectional area and a portion of reduced cross-sectional area. The portions of reduced cross-sectional area are of a material with a higher electromigration limit or immunity, whereas the portions of increased cross-sectional area are of a material with lower electromigration limit or immunity. For each write conductor, the portion of reduced cross-sectional area spans a group of memory cells of a certain number that defines a word. In one embodiment, the particular number may be 8 or 16, although other numbers are possible. The portion of reduced cross-sectional area defines a local write line (LWL) that is proximate to the group of memory cells that make up the word. Other portions of an X-write conductor include a common global write line (CGWL). The CGWL is a trunk line from which a plurality of local write lines branch, each along a particular row. In one embodiment, for each group of memory cells defined above there is a write transistor that serves as a sink for a write current. In use, a write current flows from the CGWL through a selected LWL, and then through the write transistor whose gate is controlled by a row global write line (RGWL). Thus, in a magnetic memory device in accordance with the present invention, for each X-write conductor only the CGWL is of increased cross-sectional area and the LWL is of reduced cross-sectional area. Since the LWL is of reduced cross-sectional area, the current density through the LWL is higher than the other sections of the write conductor resulting in a higher magnetic field in the vicinity of the LWL. This higher magnetic field is used in write operations to the group of magnetic memory cells forming the word. Given that the LWL is of a material of higher electromigration limit, the reliability problems induced by electromigration are avoided or at least reduced. Further, since only the LWL is of reduced cross-sectional area, the voltage drop across an X-write conductor is limited.

Turning now to FIG. 1 of the drawings, there is shown a schematic drawing of a magnetic memory device 10 in accordance with one embodiment of the invention. The device 10 includes a number of magnetic memory cells 12 arranged in an array having rows and columns. In FIG. 1, only a few of the memory cells 12 along a single row are shown. In the embodiment 10, the memory cells 12 define an 8-bit wide word. In other embodiments the word size may be 16 bits or any other word size. Each memory cell 12 may comprise a thin film stack fabricated to exhibit the magnetoresistive effect (e.g. GMR or TMR). The thin film stack comprises a magnetic storage layer which can be magnetized during a write operation. The device 10 includes X-write conductors oriented in an X direction and Y-write conductors oriented in a Y direction. As will seen, the X and Y directions are mutually perpendicular. During a write operation a selected magnetic memory cell 12 responds to a cumulative magnetic field generated by currents flowing in the X and Y write conductors associated with the magnetic memory cell 12.

As will be seen, each X-write conductor includes a CGWL 14 and a LWL 16. The LWL 16 is of reduced cross-sectional area relative to the CGWL 14. In one embodiment, a ratio of the cross-sectional areas of the LWL 16 to the CGWL 14 is 1:4. The reduction in the cross-sectional area of the LWL 16 may be achieved by reducing its width, height, or both relative to the CGWL 14. In one embodiment the CGWL 14 may be 3000 to 4000 Angstroms thick, whereas the LGWL 16 may be 200 to 1000 Angstroms thick.

In one embodiment, the LWL 16 may be of a material with relatively high electromigration limit such as tantalum or tungsten, whereas the CGWL 14 may be of a material with a relatively low electromigration limit such as copper, aluminum, or aluminum alloy.

As will be seen the LWL 16 is connected to ground potential through a switching device in the form of a transistor 20 whose gate is controlled by a read global write line (RGWL) 18. The transistor 20 is part of a selection device to allow selection of the LWL 16 for current pass-through as will be described.

Figure 2:
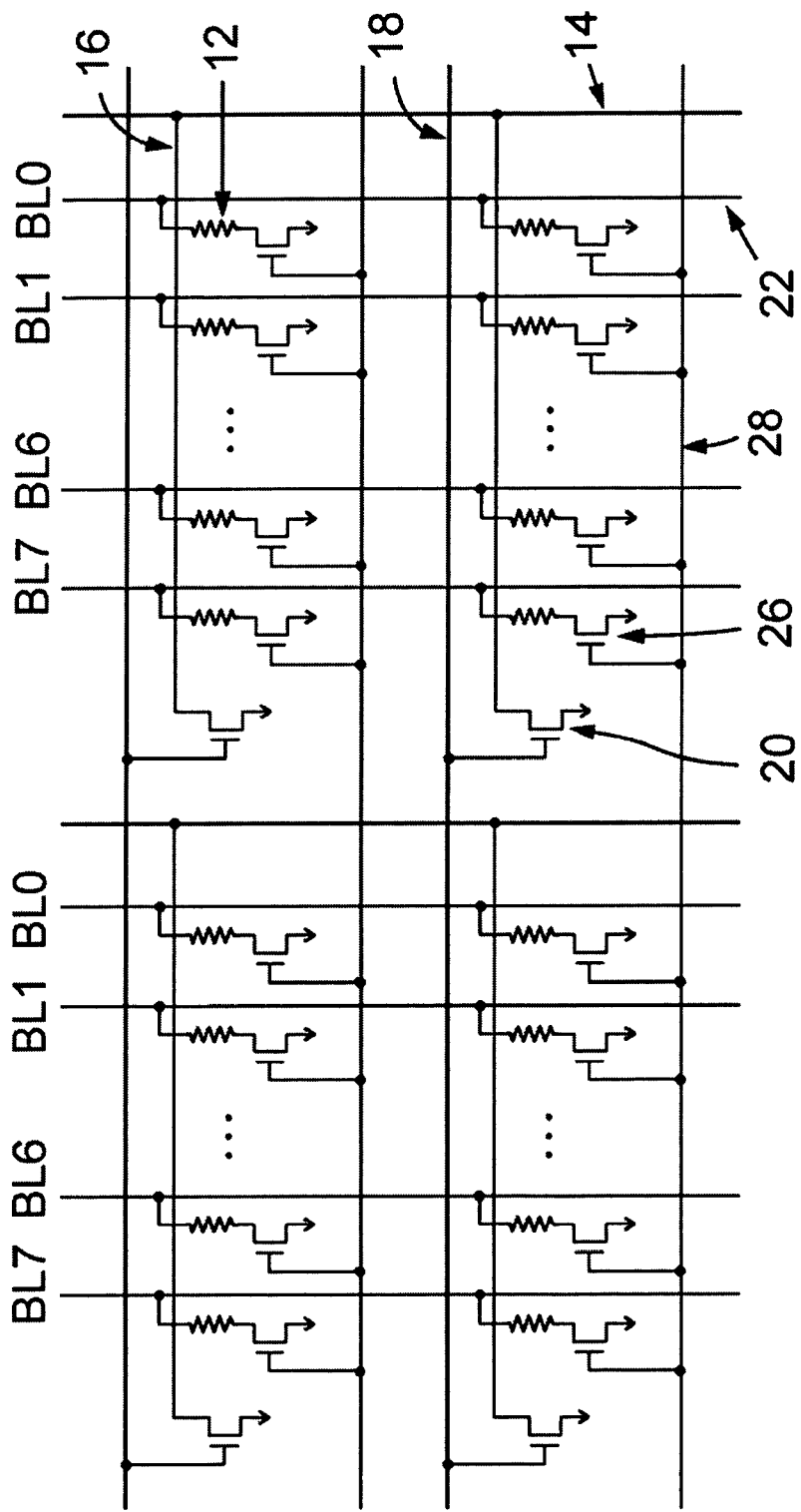
FIG. 2 shows a wiring diagram for the magnetic memory device of FIG. 1.

The magnetic memory device 10 also includes a number of Y-write conductors (bit lines) 22 each positioned above a corresponding memory cell 12. The conductors 22 are indicated as BL0 to BL7. Electrodes 24 connect each memory cell 12 in the word to a read access transistor 26. Turning now to FIG. 2 of the drawings, a wiring diagram for the magnetic memory device 10 is shown. As will be seen the memory device comprises an array of memory cells arranged in rows and columns. Along each row, the memory cells 12 are arranged in groups to form words of a fixed size. In this case, the word size in 8 bits. BL0 to BL7 indicate Y-write conductors or bit lines, each corresponding to a memory cell in a word. Each memory cell is connected to a common ground line via a read access transistor 26. A digit line (DL) 28 controls the read access transistors thus turning them on during read operations. For write operations current flow is through CGWL 14, LWL 16, and BL 22 for a selected memory cell 12. More particularly, for a write operation, current flows from a CGWL 14 and branches and flows through a selected LWL 16. The RGWL 18 coupled to the selected LWL 16 controls the transistor 20 whereby the selected LWL 16 is connected to ground potential. Thus, the transistors 20 and the RGWL 18 together define a selection device to select a particular word to be written to. The other component of the write current flows in each of the bitlines BL0 to BL7 thus creating a cumulative field to write data to the memory cells.

The disclosed device may be fabricated with conventional CMOS semiconductor processes and a backend magnetic process. For example, read access transistor 26 and write transistor 20 may be fabricated with a CMOS semiconductor process. Each LWL 16 may be patterned over a read access transistor 26 and a write transistor 20 after $2^{nd}$ or higher metal levels have been completed with a conventional dry etch or damascene process. Each LWL 16 may be connected to a write transistor through a contact-via hole stack. A dielectric layer may be deposited on each LWL 16 to insulate it from a memory cell 12. Each memory cell 12 which is made of a GMR or TMR material stack may be fabricated using sputter deposition, ion milling or reactive ion etching and magnetic annealing. Bottom electrodes 24 and memory cells 12 may be deposited and patterned with conventional magnetic Back End Of Line (BEOL) processes. Each bottom electrode 24 may be connected to a read access transistor 26 through a contact-via hole stack. BL metals 22 may be deposited and patterned following the deposition of dielectric insulation and the formation of the via hole opening. CGWL 14 and BL 220 are fabricated after RGWL and LWL fabrication. CGWL 140 may be connected to LWL through a via hole. LWL may be connected to a write transistor through a via hole.

The invention claimed is:

1. A magnetic memory device, comprising:
   a plurality of magnetic memory cells arranged to form rows; and
   first write conductors to energize the cells during write operations, each write conductor having at least some portion of increased cross-sectional area and a portion of reduced cross-sectional area; wherein the portions of reduced cross-sectional area are of a material having a higher electro-migration limit than the portions of increased cross-sectional area.

2. The magnetic memory device of claim 1, wherein the first write conductors each comprise a common global write line corresponding to a first portion of increased cross-sectional area, a local write line that branches from a common global write line, the local write line corresponding to the portion of reduced cross-sectional area.

3. The magnetic memory device of claim 2, wherein the common global write line feeds several local write lines.

4. The magnetic memory device of claim 3, wherein each of the several local write lines spans a group of magnetic memory cells in a row defining a word.

5. The magnetic memory device of claim 4, wherein the word comprises one of 8 or 16 bits.

6. The magnetic memory device of claim 4, wherein each local write line extends longitudinally along a row.

7. The magnetic memory device of claim 1, wherein a ratio of the portions of reduced cross-sectional area to the portions of increased cross-sectional area is 1:4.

8. The magnetic memory device of claim 1, wherein the portions of reduced cross-sectional area have a smaller thickness than the portions of increase cross-sectional area.

9. The magnetic memory device of claim 1, wherein the portions of reduced cross-sectional area have a smaller width than the portions of increase cross-sectional area.

10. The magnetic memory device of claim 4, further comprising a word selection device to select a particular group of memory cells defining a word to be written to during a write operation.

11. The magnetic memory device of claim 10, wherein the word selection device comprises a write transistor to connect each local write line to a ground potential.

12. The magnetic memory device of claim 11, wherein the write transistor is controlled by read common global line.

13. The magnetic memory device of claim 4, further comprising second write conductors, each associated with a memory cell and extending in a direction transverse to the first write conductors.

14. The magnetic memory device of claim 13, wherein each second write conductor is connected to ground potential through a dedicated read access transistor.

15. The magnetic memory device of claim 14, further comprising a single line to control the read access transistors associated with each group.

* * * * *